United States Patent [19]

Hidaka

[11] Patent Number: 5,019,551

[45] Date of Patent: May 28, 1991

[54] SUPERCONDUCTING CONTACT STRUCTURE

[75] Inventor: Mutsuo Hidaka, Tokyo, Japan

[73] Assignee: NEC Corporation, Japan

[21] Appl. No.: 240,930

[22] Filed: Sep. 6, 1988

[30] Foreign Application Priority Data

Sep. 10, 1987 [JP] Japan ................... 62-227637

[51] Int. Cl.⁵ ............................................. B32B 9/00
[52] U.S. Cl. ..................................... 505/1; 505/701; 505/702; 505/703; 505/704; 428/457; 428/688; 428/901; 428/930
[58] Field of Search .................. 505/1, 701–704; 428/688, 457, 901, 930

[56] References Cited

PUBLICATIONS

IEEE Transaction on Magnetics, vol. MAG-19, No. 3, May 1983 "All Refractory Josephson Tunnel Junctions Fabricated by Reactive Ion Etching".

High Temperature Electrical Properties of $Y_1Ba_2Cu_3O_{7-\delta}$, Park et al., Jap. Journal Appl. Phys. 27(2), Feb. 88.

Primary Examiner—Patrick J. Ryan
Attorney, Agent, or Firm—Laff, Whitesel, Conte & Saret

[57] ABSTRACT

In a superconducting contact structure between an oxide superconductor and a metal superconductor, the oxide superconductor has a recess in a surface which is in contact with the metal superconductor.

7 Claims, 2 Drawing Sheets

SUPERCONDUCTING CONTACT STRUCTURE

BACKGROUND OF THE INVENTION

The present invention relates to a superconducting contact structure formed by an oxide superconductor and a metal superconductor in a superconductor IC or the like.

An oxide represented by yttrium-barium-copper oxide (YBCO) as described in Physical Review Letters, Vol. 58, P. 908 serves as a superconductor at a relatively high critical temperature. YBCO as a superconductor has a critical temperature of 97 K. A circuit combining this oxide superconductor and a metal superconductor represented by niobium may be arranged. In this case, a superconducting contact between these two superconductor materials must be established.

FIG. 1 shows a typical conventional example of a superconducting contact structure made of two metal superconductors. A superconductor 14 is brought into contact with a superconductor 12 through a contact hole in an insulating film 13, thereby establishing a superconducting contact.

A critical, largely anisotropic, superconducting current in YBCO is described in Japanese Journal of Applied Physics, Vol. 26, P. L1248. The superconducting critical current density in a direction perpendicular to the layer is about one percent of that in a direction parallel to the layer. When an oxide superconductor is formed so that the layer is parallel to a substrate 11, it is necessary to supply a large amount of current in a direction parallel to the substrate 11. A small superconducting current is not supplied in the vertical direction, and therefore good superconducting contact cannot be obtained. In order to prevent a decrease in the critical current density, the contact area is 100 times the cross-sectional area of the superconductor 12. However, such a large contact hole is not preferable in view of a need to make things smaller in order to achieve a greater; integration density.

SUMMARY OF THE INVENTION

It is an object of the present invention to provide a good superconducting contact between an oxide superconductor and a metal superconductor.

In order to achieve the above object of the present invention, a superconducting contact structure is provided between an oxide superconductor and a metal superconductor. The oxide superconductor has a recess in a surface which is in contact with the metal superconductor.

DETAILED DESCRIPTION OF THE PREFERRED EMBODIMENTS

Figure 1:
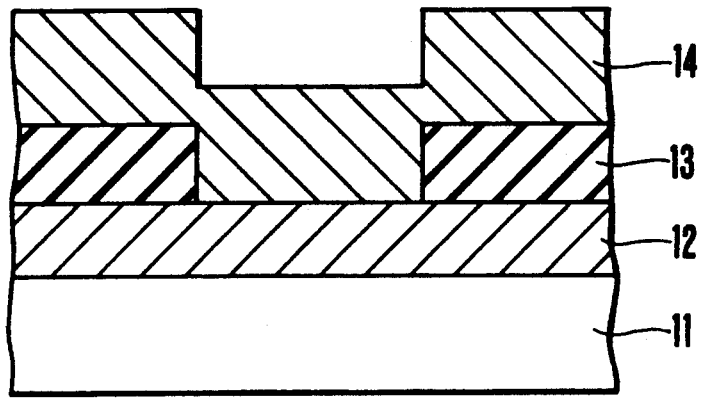
FIG. 1 is a cross-sectional view showing a conventional superconducting contact structure.
Figure 2:
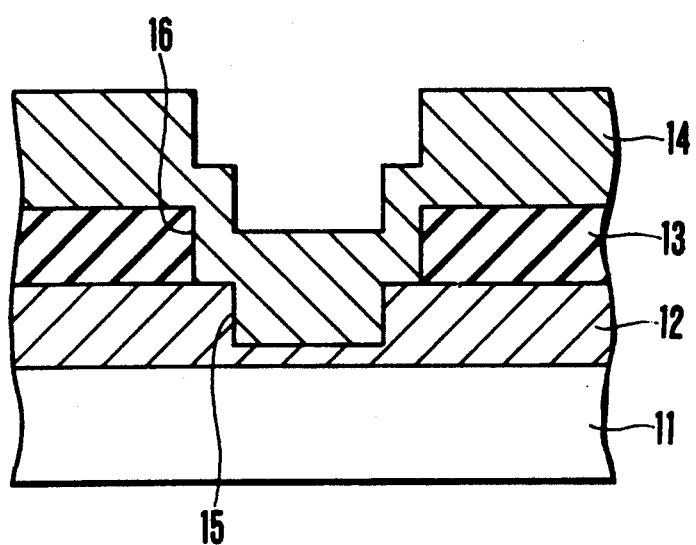
FIG. 2 is a cross-sectional view showing a superconducting contact structure according to an embodiment of the present invention.

FIG. 2 shows a superconducting contact structure according to an embodiment of the present invention. Referring to FIG. 2, a 500-nm thick and 5 $\mu$m wide superconductor film 12 consisting of YBCO as an oxide superconductor and having a layer structure parallel to a substrate 11 is formed on the substrate 11. A recess 15 having a width of 2 $\mu$m, length of 5 $\mu$m, a depth of 450 nm and a direction perpendicular to a longitudinal direction of the superconductor film 12 is formed in the superconductor film 12. A 500-nm thick insulating film 13 composed of silicon dioxide is formed on the superconductor film 12. A contact hole 16 having a width of 3 $\mu$m and a length of 5 $\mu$m is formed in the insulating film 13 so as to include the recess 15 of the superconductor film 12. A superconductor film 14 consisting of niobium, as a metal superconductor is formed on the surface of the insulating film 13 and over the inner surfaces of the contact hole 16, and down into the recess 15 so as to fill the entire recess 15 with the metal superconductor and is brought into contact with the superconductor film 12.

With the above structure, superconductor electrons flowing along the oxide superconductor film 12 can flow directly into the metal superconductor film 14. Since critical current density anisotropy is not present in the metal superconductor film 14, the superconducting critical current density is increased at the contact portion between the superconductor films 12 and 14.

At least 90% or more of the horizontal critical current of the superconductor film can be obtained at the contact portion, although the small contact hole 16 has a size of 5×3 $\mu$m. When the width of the recess 15 of the superconductor film 12 is increased to dimensions close to the width of the contact hole 16, the current densities of the structure of the embodiment and is further increased.

When the structure of the above embodiment is used, the critical current of the superconducting contact portion between the oxide superconductor film 12 and the metal superconductor film 14 can be increased and the contact area can be reduced.

Figure 3:
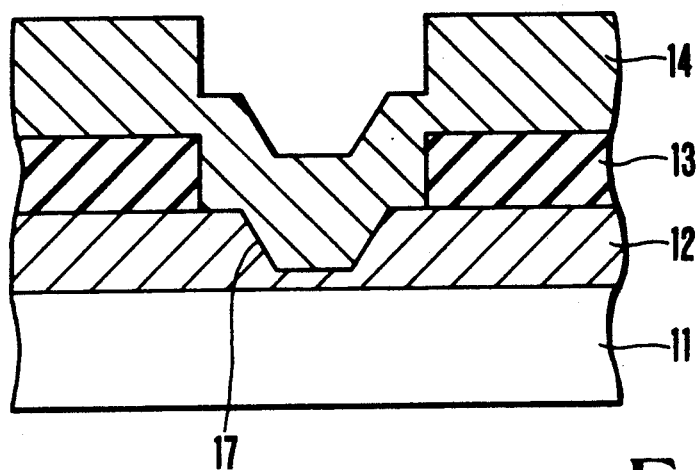
FIG. 3 is a cross-sectional view showing a superconducting contact structure according to another embodiment of the present invention.

FIG. 3 shows a superconducting contact structure according to another embodiment of the present invention. In this embodiment, a recess 17 in of a superconductor film 12 is tapered. Other arrangements of this embodiment are the same as those in FIG. 2. Since the recess 17 of the superconductor film 12 is tapered, a contact area is increased between the superconductor film 12 and a superconductor film 14 thus obtaining a more rigid superconducting contact structure.

In order to taper the hole 17, for example, a mask pattern is tapered. Etching is performed by using a Cl$_2$ gas or the like so as to transfer the taper to the underlying superconductor film 12.

Figure 4:
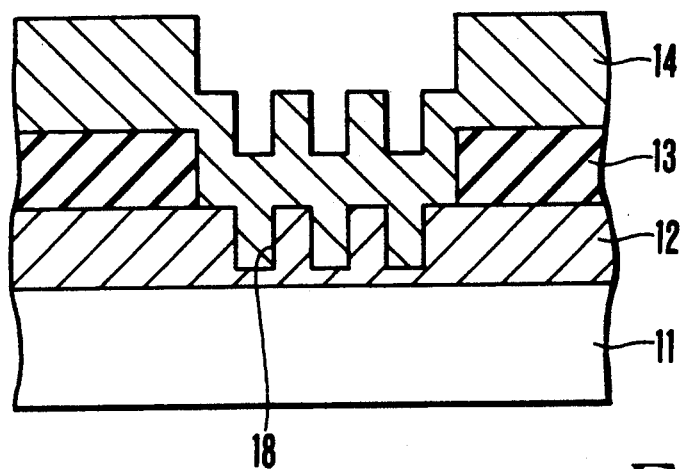
FIG. 4 is a cross-sectional view showing a superconducting contact structure according to still another embodiment of the present invention.

FIG. 4 shows a superconducting contact structure according to still another embodiment of the present invention. Unlike in FIGS. 2 and 3, FIG. 4 is a cross-sectional view of the superconductor film 12 in a direction perpendicular to the longitudinal direction thereof. In this embodiment, a plurality of recesses 18 are formed in a superconductor film 12. Since the superconductor film 12 has the plurality of recesses 18, the contact area between the superconductor film 12 and a superconductor film 14 can be increase in he horizontal direction. Therefore, a critical current density of the superconducting contact portion can be further increased.

In the superconducting contact structure according to the present invention, as has been described above, good superconducting contact having a large superconducting critical current can be achieved between a metal superconductor film and an oxide superconductor having a high critical current anisotropy level.

What is claimed is:

1. A superconducting contact structure for making an electrical connection between a layer of yttrium-barium-copper oxide superconductor and a layer of metal superconductor formed layer on layer, wherein said oxide superconductor is formed on a substrate and comprises a layered structure with surfaces of said layers being parallel to the surface of said substrate, and has at least one recess formed in a surface of said oxide superconductor, said recess having sidewalls and a bottom surface, all of which are in contact with said metal superconductor.

2. A superconducting contact structure according to claim 1, wherein said structure can conduct a large amount of current between said oxide superconductor and said metal superconductor via said side walls, bottom surface, and at least of a portion of a surface between said oxide superconductor and metal superconductor.

3. A superconducting contact structure according to claim 1, wherein said recess comprises a recess with a vertically tapered side wall, said taper being formed in order to become more narrow in a direction of the thickness of said oxide superconductor from said surface thereof.

4. A superconducting contact structure according to claim 1, wherein said recess comprises a bottom recess surface with a vertically stepped wall, said steps being formed in a direction of the thickness of said oxide superconductor and extending downwardly from said surface thereof.

5. A superconducting contact structure according to claim 1, wherein said recess comprises a plurality of recesses formed in a direction of the thickness of said oxide superconductor from said surface thereof.

6. A superconducting contact structure according to claim 1, wherein said oxide superconductor is connected through an insulating layer to a metal superconductor.

7. A superconducting contact structure between a layer of yttrium-barium-copper oxide superconductor and a layer of metal superconductor formed layer on layer, wherein said oxide superconductor is formed on a substrate and comprises a layered structure parallel to the substrate, and wherein at least a recess is formed in a surface of said oxide superconductor so that almost all current is supplied in said oxide superconductor and in parallel to said substrate.

* * * * *